United States Patent
Maloney

(10) Patent No.: US 8,144,470 B2
(45) Date of Patent: Mar. 27, 2012

(54) TWO-PIECE HEAT SINK STUD

(75) Inventor: Michael J. Maloney, Doylestown, PA (US)

(73) Assignee: PEM Management, Inc., Wilmington, DE (US)

( * ) Notice: Subject to any disclaimer, the term of this patent is extended or adjusted under 35 U.S.C. 154(b) by 79 days.

(21) Appl. No.: 12/781,014

(22) Filed: May 17, 2010

(65) Prior Publication Data

US 2010/0296255 A1   Nov. 25, 2010

Related U.S. Application Data

(60) Provisional application No. 61/180,264, filed on May 21, 2009.

(51) Int. Cl.
*H05K 7/20* (2006.01)

(52) U.S. Cl. ......... 361/719; 361/697; 361/694; 361/695

(58) Field of Classification Search .................... 361/697
See application file for complete search history.

(56) References Cited

U.S. PATENT DOCUMENTS

| | | | |
|---|---|---|---|
| 2,554,876 A | 5/1951 | Olson | |
| RE23,547 E | 9/1952 | Fox | |
| 3,381,263 A | 4/1968 | Gehrt et al. | |
| 5,677,829 A * | 10/1997 | Clemens | 361/697 |
| 6,017,185 A * | 1/2000 | Kuo | 415/177 |
| 6,118,657 A * | 9/2000 | Clemens | 361/697 |
| 6,311,766 B1 * | 11/2001 | Lin et al. | 165/80.3 |
| 6,407,920 B1 * | 6/2002 | Jui-Yuan et al. | 361/697 |
| 6,497,273 B1 | 12/2002 | Horng et al. | |
| 6,520,250 B2 * | 2/2003 | Lee et al. | 165/121 |
| 6,640,882 B2 | 11/2003 | Dowdy et al. | |
| 7,116,566 B2 * | 10/2006 | Yang et al. | 363/41 |
| 7,142,422 B2 | 11/2006 | Lee et al. | |
| 7,243,709 B2 | 7/2007 | Chen et al. | |
| 7,359,200 B2 | 4/2008 | Zhou et al. | |
| 7,430,122 B2 | 9/2008 | Li | |
| 7,672,126 B2 * | 3/2010 | Yeh et al. | 361/695 |
| 2006/0238979 A1 * | 10/2006 | Liu | 361/699 |
| 2007/0242433 A1 | 10/2007 | Lin et al. | |
| 2008/0130228 A1 | 6/2008 | Zhou et al. | |

\* cited by examiner

*Primary Examiner* — Gregory Thompson
(74) *Attorney, Agent, or Firm* — Gregory J. Gore

(57) ABSTRACT

A fastening system for a heat sink mounted on a circuit board utilizes a self-clinching stud assembly constructed by axially interfitting two flat sheet metal members. Each member has forked ends which when axially plugged together in criss-cross fashion create a unified fastener with side structures that can permanently clinch into a heat sink. After attachment to the heat sink, the stud presents two opposite attachment ends with tines which extend from the top and bottom of the heat sink. As finally assembled, a fan attaches to the top end of the studs above the heat sink while the opposite end of the stud which extends from the bottom of the heat sink passes through the circuit board to attach to a retaining leaf spring which presses against the back side of the board. Thus, all of the components are joined by a single stud.

16 Claims, 5 Drawing Sheets

TWO-PIECE HEAT SINK STUD

RELATED APPLICATION

This patent application is related to provisional patent application Ser. No. 61/180,264 entitled "Two-Piece Heat Sink Stud" filed on May 21, 2009, priority from which is hereby claimed.

FIELD OF THE INVENTION

The present invention relates to an electronic assembly and more specifically to through-studs which attach electronic devices sandwiched together to a circuit board. More specifically, the invention relates to a fastening structure which simultaneously joins a cooling fan, a heat sink, a computer processor, a circuit board and a retaining spring clip.

BACKGROUND OF THE INVENTION

Computer processors and graphics generator electronics produce excessive waste heat. This heat must be removed from the processor chip to avoid damage to the chip. Extruded heat sinks and plastic fans are often employed to remove this excess heat and keep the processing chip cool. Some heat sink systems incorporate a fan that is fastened to the top of the heat sink to increase heat dissipation.

It is imperative that the heat sink be pressed firmly in place against the processing chip for maximizing heat transfer to ensure proper cooling. In pressing the heat sink against the processor chip many systems use spring-loaded snap pins or shoulder screws on the four corners of the heat sink. If the springs are not sized properly, or if the circuit board material happens to be thinner than originally specified, damage to the PC board can occur since the spring force can cause bending of the board beneath the heat sink. This bending can break electrical contacts on the board, or even dislodge the processing chip causing failure of the electronic device. To solve this problem, another method employs an "X" shaped leaf spring in which the four arms of the spring located on the backside of the circuit board pull on studs installed at the four corners of the heat sink.

In all of the above cases however, separate fastening devices are used to mount the fan to the top of the heat sink. These are most commonly screw-type fasteners which require lengthy assembly time and a multiplicity of parts further adding to the manufacturing cost of the assembly. There is therefore a need in the art for a simplified method of mounting the heat sink/fan assembly to a circuit board over the computer processor which is reliable, easy to assemble, and economical.

SUMMARY OF THE INVENTION

In order to solve the problem in the art, the present fastening system has been devised. This fastening system utilizes a self-clinching stud assembly constructed by axially interfitting two flat sheet metal members. Each member has forked ends which when axially plugged together in criss-cross fashion create a unified fastener with side structures that can permanently clinch into a heat sink. After attachment to the heat sink, the stud presents two opposite attachment ends with tines which extend from the top and bottom of the heat sink. As finally assembled, a fan attaches to the top end of the studs above the heat sink while the opposite end of the stud which extends from the bottom of the heat sink passes through the circuit board to attach to a retaining leaf spring which presses against the back side of the board. Thus, all of the components are joined by a single stud. The axially extending tines at the ends of the stud are radially inwardly deflectable to permit snap-fit engagement with holes in the spring at one end and holes in a flange of the fan at the other end. This eliminates the need for additional fasteners and greatly simplifies the assembly process.

The stud-forming members are different from each other providing different functions. The first of the two members has bulb-like features on the top, end each of which is tapered along its top edge to facilitate being pushed over the attachment hole of the fan flange. A taper on the bottom of each bulb of this member stays in contact with the top surface of the fan flange to provide a small downward force under normal conditions. The adjacent attachment structures of the second mating member of the stud each also has a taper along its top edge, but unlike its counterpart has a lateral edge on the bottom side forming a locking barb which prevents the fan from being removed without the aid of a tool. This locked engagement of the fan also prevents the accidental disassembly of the fan should a shock loading occur, such as in the accidental dropping of the electronic unit.

The tines at the bottom end of both members of the stud form a radially symmetrical barbed head that, like the top end, is inwardly compressible. This allows the bottom end of the stud to provide snap-fit engagement with a hole in the leaf-type spring on the backside of the circuit board. Both of the members which form the fastener have radially symmetrical clinch structures at the same point along their assembled length. These include displacer and undercut features which when pressed into the heat sink permanently attach the stud. This mutual attachment to the heat sink further unifies the two component parts which form the stud.

More specifically, the Applicant has invented a stud fastener comprising two planar elongate first and second members of equal length each having top and bottom ends with longitudinal side surfaces extending therebetween. The first member has a central lengthwise lower slot extending from its bottom end up to a lateral bridge portion. The second member has a central lengthwise upper slot extending from its top end down to a lateral blade portion. The members are matingly engaged longitudinally and radially crosswise such that the blade of the second member is received by the lower slot of the first member and the bridge of the first member is received by the upper slot of the second member such that the top ends of both members are in alignment lengthwise. When engaged, the members are preferably radially displaced at 90° to each other. Attachment means on the side surfaces of the members include clinch fastening displacers and undercuts so that when the members are press-fit into an aperture of the host material, in this case a heat sink, the stud is secured thereto by the cold flow of host material into the undercuts. The first member includes two top tines extending upwardly from the bridge portion to a topmost end and two bottom tines extending downwardly from the bridge portion to a bottommost end. The second member includes two bottom tines extending downwardly from the blade portion to a bottommost end and two top tines extending upwardly from said upper slot. The attachment means further include inwardly deflectable snap-fit barbs at the ends of the bottom ends of both members and the top tines of the second member. The top tines of the first member are bulbs having tapers on their lower sides.

When assembling a cooling fan to the heat sink, these bulbs apply downward pressure on a fan housing flange such that the barbs and the bulbs provide snap-fit attachment of the stud to the fan housing flange such that the fan is secured in a releasable operative position with respect to the heat sink. The bottom tines of both members extend downward from the heat sink. Adding to the assembly to include a circuit board holding an electronic device which contacts the bottom surface of the heat sink, the snap-fit attachment means at the bottommost end of the stud are employed to engage compression spring means operative between said stud and said circuit board.

Thus, the fastener and fastening system disclosed herein present an affordable solution to attaching a heat sink to the processing chip and circuit board, and then the fan to the heat sink, with each fastener extending through the heat sink. The fasteners are preferably used with a leaf-type spring described above. These fasteners provide the benefit of snap attachment that does not require additional screws thus simplifying the assembly and number of separate parts, contributing to its economy of manufacture.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out the several purposes of the present invention. It is important, therefore, that the claims be regarded as including such equivalent constructions insofar as they do not depart from the spirit and scope of the present invention.

DESCRIPTION OF THE PREFERRED EMBODIMENT

Figure 1:
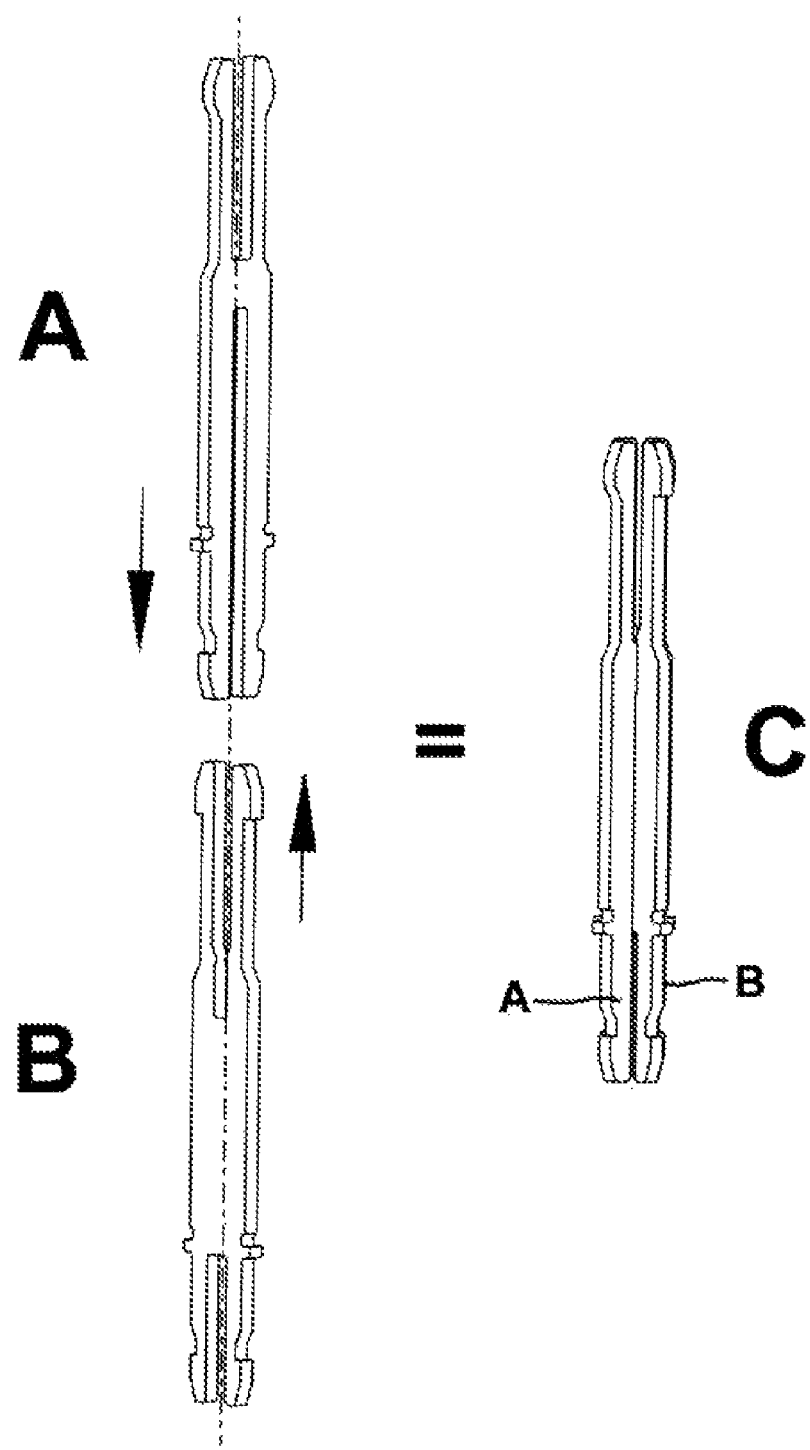
FIG. 1 is a top front isometric assembly view showing the sequence of assembly of the first and second parts of the mounting stud.

Referring now to FIG. 1, two interfitting parts A and B when axially plugged together comprise the assembled mounting stud C. The two parts are preferably, but not limited to, flat sheet metal stampings composed of a metal which is suitable for its intended purpose such as steel. In the completed stud C, the first member A and second member B are shown united with side edge features spaced 90 degrees apart. The individual parts are coextensive being flush at both opposite ends. The resultant mounting stud is sufficiently strong so that it can provide the force necessary to firmly join the fan heat sink, circuit board, and spring components as further described below. Because the stud may be manufactured from inexpensive stamped sheet metal, it is very economical to produce but it is not limited to this method of production. The parts could also be photo etched, laser cut, wire edm cut or water jet cut from flat blanks Referring now to FIGS. 2 and 3, the two interfitting halves which form the mounting stud are shown in more detail. Each is symmetrical about its longitudinal axis, one side being a mirror image of the other. Therefore, it is sufficient to adequately describe these parts that the features of only one side be enumerated to fully understand each part. When united with its counterpart, the resulting structure forms a cross-linked elongate unit that for these purposes has been referred to as a "stud", although its cross-sectional geometry is a cross-shape and not the more conventional circular shape.

Figure 2:
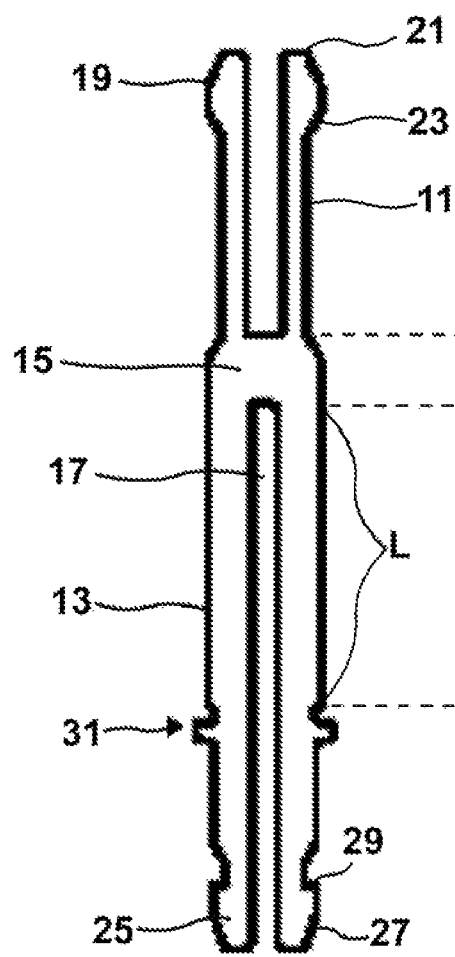
FIG. 2 is a front elevation view of the first member of the mounting stud.

Referring now in specific detail to this first of two parts shown in FIG. 2, this half is the major receiving part which includes elongate tines 13 that extend downward from a bridge portion 15. Between tines 13 lies a slot 17 that accepts the second part when the two parts are plugged together. The portion L of the receiving slot 17 accepts a blade portion 12 of the second member further described in FIG. 3. Displacer and undercut clinch features 31 are located immediately below this portion. These features provide clinch attachment of the assembled stud into the material of the heat sink as shown in FIG. 4.

The tines 13 extend farther downward below the clinch features and terminate in a bottom end which includes barb-shaped structures. The barbs have angled approach sides 27 and lateral backside edges 29 that provide locking snap-fit attachment. Top tines 11 extend above the bridge 15 and terminate in arcuate features 19 hereinafter referred to as "bulbs". The top and bottom edges of the bulb of this member include tapers 21 and 23. Taper 21 functions as a lead-in for snap-fit insertion. In use, taper 23 bears against the top edge of an attached panel, in this case the fan flange as shown in more detail in FIG. 6a. The dimensions and material of these tines is selected so that they are inwardly deflectable for snap-fit attachment.

Figure 3:
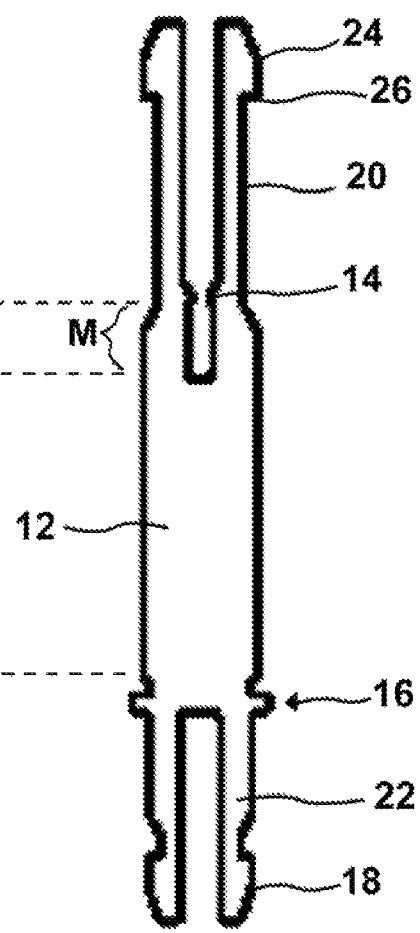
FIG. 3 is a front elevation view of the second member of the mounting stud.
Figure 4:
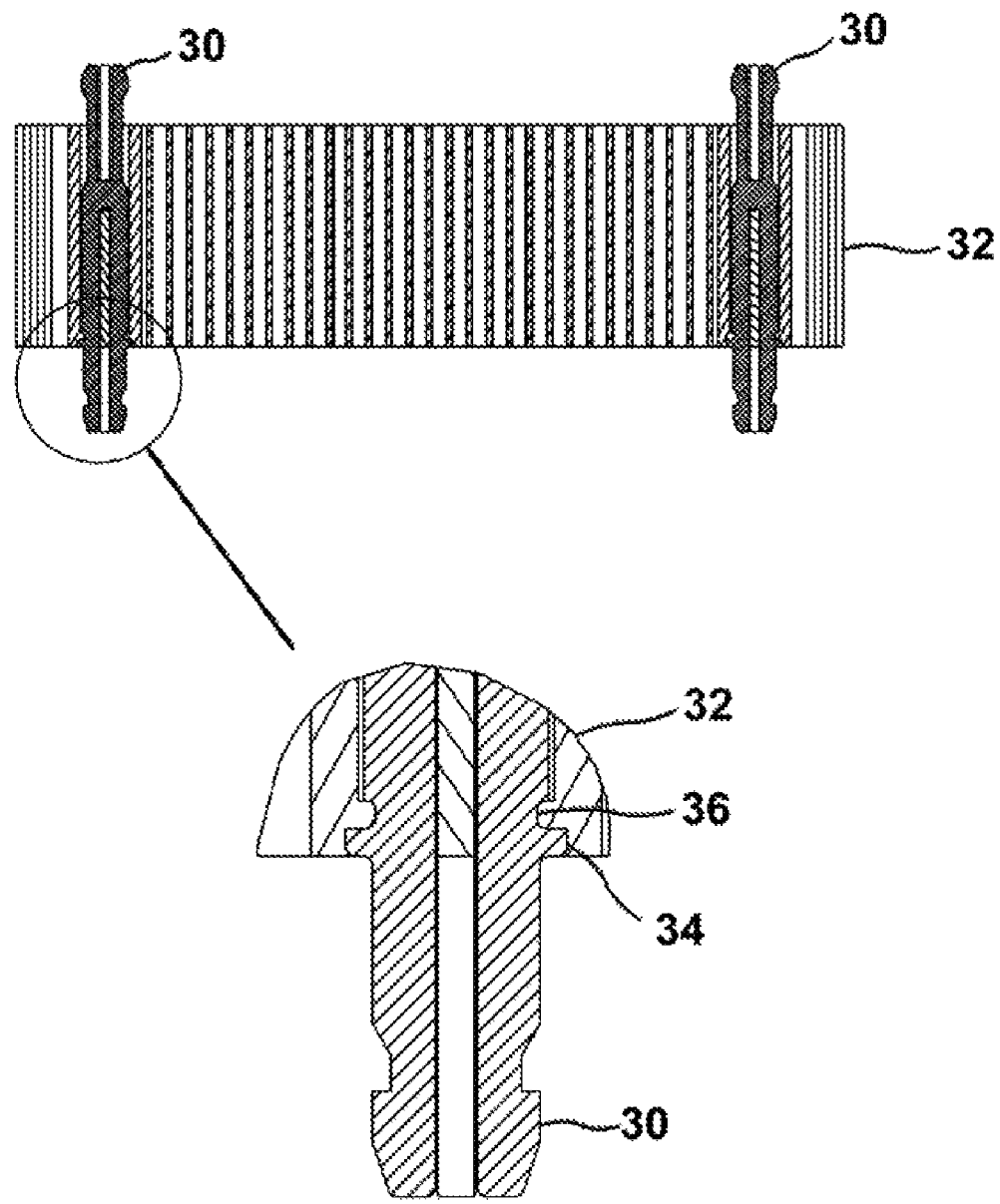
FIG. 4 is a front elevation sectional view.

Referring now to FIG. 3, the interfitting counterpart to the first member of the stud is shown. Like the first member, the second member includes both male and female portions along a central section which are received by the first member described in FIG. 2. These structures include central blade member 12 which upon assembly is placed into the receiving slot portion L of the first member as slot portion M of the second part receives the bridge element 15 of the first part. Inward facing teeth 14 abut the top of the bridge 15 to prevent the two parts from axial separation. Like the first member, this second member also includes upward and downward extending tines 20 and 22 respectively. Also included are matching displacer and undercut side features 16 and barbs 18 at the bottom end. These features of the second part are identical to those of the first part. Unlike the first member however, the snap-in features 24 at the top of the second member are not bulbs but barbs with lateral underside edges 26 that provide a locking feature for the attached fan flange as seen in greater detail in FIG. 6b.

Assembly of the electronic components utilizing the mounting stud of the present invention proceeds as follows. First, four of the fasteners 30 are clinched into each corner of the heat sink 32 as shown in FIG. 4. The displacer features 34 of the studs are pressed into the heat sink and the cold flow of metal into the undercut areas 36 are filled with the heat sink material, usually aluminum. This rigidly and permanently mounts the studs 30 to the heat sink 32. The ends of the studs extend above and below the top and bottom surfaces of the heat sink for snap-fit attachment to the other components as shown in FIG. 5.

Figure 5:
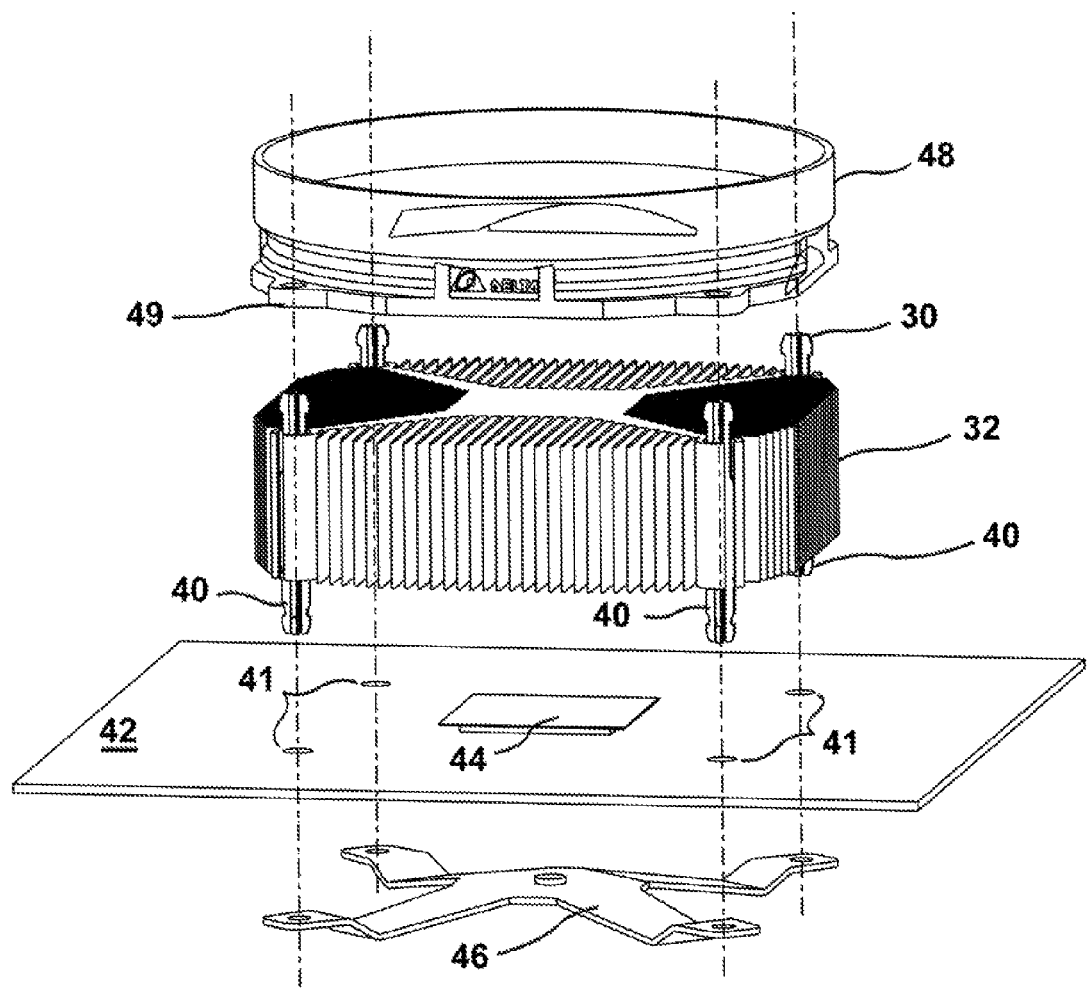
FIG. 5 is a top front left isometric assembly view.

Referring now to FIG. 5, the assembly continues by inserting the bottom ends of the fasteners 40 through four holes 41 in a PC board 42. An "X" shaped spring 46, which has an insulated protrusion at the center and one hole in the end of each leg, is snapped over the bottom spring retention portion of the fasteners as shown in more detail in FIG. 6c. The protrusion at the center of the spring presses on the PC board directly opposite the chip 44 which is being cooled. Lateral edges on the spring retention barbs of the studs prevent the spring from coming off without the use of a tool once it is snapped into place. Then, flange 49 of the fan housing 48 is simply pressed over the top bulbs and snapped into place on the studs on top of the heat sink.

Figure 6:
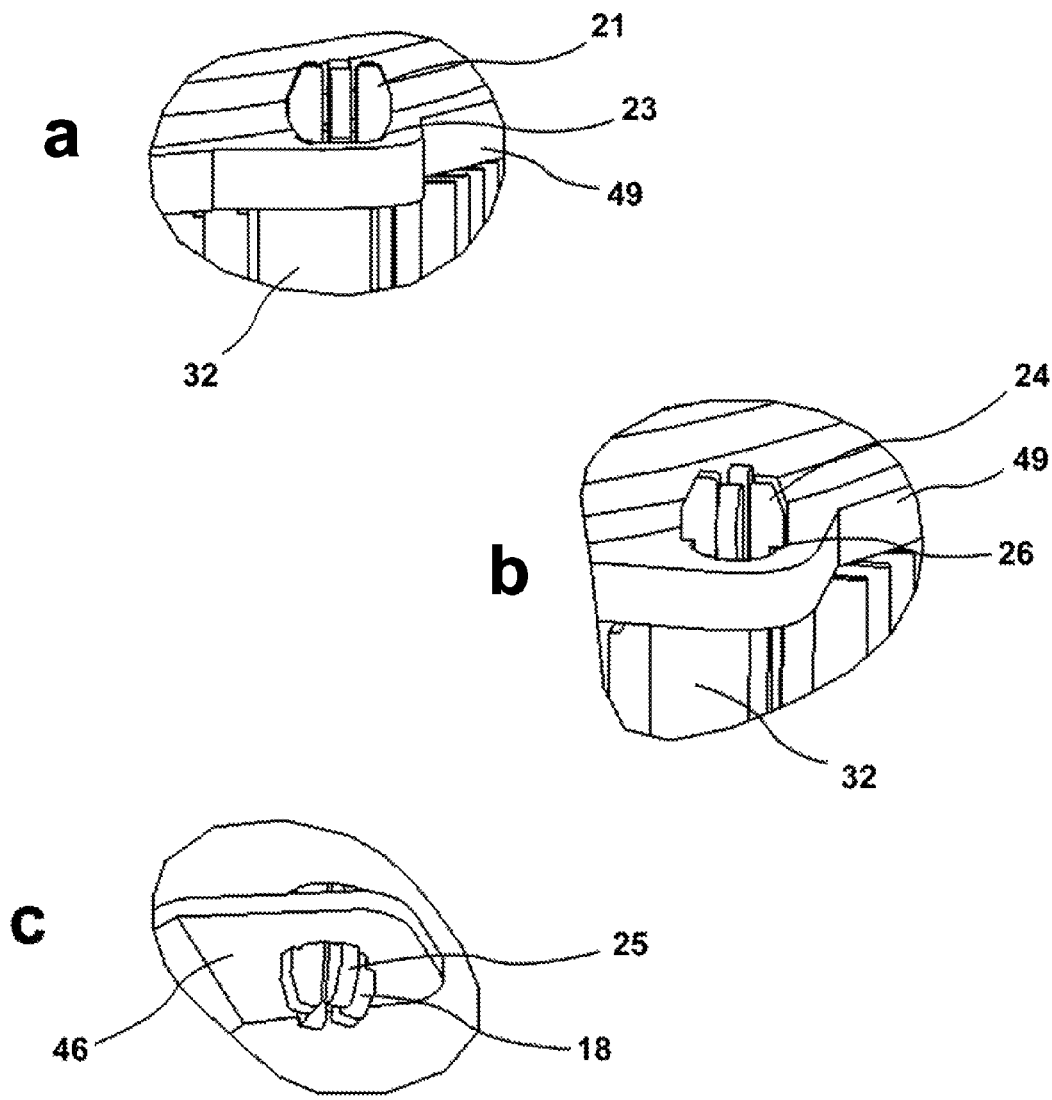
FIG. 6 is three top left front isometric views A, B and C.

Referring now to FIGS. 6a and 6b, as previously described, the two tapers 23 on the lower side of the top bulb of the first member keep a downward pressure on a flange 49 of the fan housing while the two lateral edges 26 of the second member 24 prevent the fan 49 from being removed without the use of a tool to compress the bulb ends. Referring to this same area of engagement seen in FIG. 6a, FIG. 6b shows the locking engagement of barbs 24 by lateral edges 26 bearing against flange 49. Because of the difference of these two members in this area, dual functions can be provided namely, a downward wedge force supplied by the resilience of the tapered tines of the first member and the locking engagement functionality provided by the barbs of the second member. FIG. 6c depicts the stud bottom end barbs of both members 25 and 18 in snap-fit engagement with the spring arm 46.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. A stud fastener comprising:
   two planar elongate first and second members of equal length each having top and bottom ends with longitudinal side surfaces extending therebetween;
   the first member having a central lengthwise lower slot extending from the bottom end up to a lateral bridge portion thereof;
   the second member having a central lengthwise upper slot extending from the top end down to a lateral blade portion thereof; and
   said members being matingly engaged longitudinally and radially crosswise such that the blade portion of said second member is received by the lower slot of said first member and the bridge portion of said first member is received by the upper slot of the second member such that the top ends of both members are in alignment lengthwise.

2. The stud of claim 1 wherein said first and second members are radially disposed at 90° to each other.

3. The stud of claim 2 wherein the width of the upper slot of the second member is equal to the thickness of the bridge portion of the first member where they are engaged and the lower slot of the first member is equal to the thickness of the blade portion of the second member where they are engaged.

4. The stud of claim 3 wherein the length of the upper slot of the second member is equal to the length of the bridge of the first member and the length of the lower slot of the first member is equal to the length of the blade of the second member.

5. The stud of claim 4 further including attachment means on said side surfaces.

6. The stud of claim 5 wherein said second member includes two bottom tines extending downward from said blade portion to a bottom end and two top tines extending upwardly from said upper slot and said first member includes two top tines extending upward from said bridge portion to a top end and two bottom tines extending downward from said bridge portion to a bottom end.

7. The stud of claim 6 wherein the attachment means further comprise inwardly deflectable snap-fit barbs at the ends of the bottom tines of both members and the top tines of the second member.

8. The stud of claim 5 wherein said attachment means comprise clinch fastening displacers and undercuts whereby the members are press-fit into an aperture of a host structure secured thereto by the cold flow of the host material into the undercuts.

9. The stud of claim 8 wherein said host structure is a heat sink having a through-hole and a bottom surface which is received by said stud and attached thereto by clinch fastening of said stud.

10. The stud of claim 9 wherein said bottom tines of both members extend downward from said heat sink and through a circuit board holding an electronic device which contacts the bottom surface of the heat sink, the snap-fit attachment means at the bottommost end of said stud engaging compression spring means operative between said stud and said circuit board.

11. The stud of claim 10 wherein said spring means is a leaf spring.

12. An stud including the fastening stud of claim 7 further described in that said top tines extend upwardly from said heat sink and through a housing flange supporting a cooling fan such that said barbs provide snap-fit attachment of said stud to said housing flange whereby said fan is secured in a releasable operative position with respect to said heat sink.

13. The stud of claim 12 further including a plurality of said studs each engaging said housing flange at the top ends of said studs and said spring at the bottom ends of said studs whereby said fan is mounted to the heat sink only by said studs.

14. The stud of claim 12 further described in that the attachment means of the top tines of the first member are bulbs having tapers on their lower sides which apply downward pressure on said fan housing flange.

15. The stud of claim 14 wherein the fan housing flange is forcibly captured between the tapers on the bulbs of the first members and a top of the heat sink.

16. The stud of claim 5 wherein said second member includes inward facing outwardly deflectable teeth on an inside surface of the top tines of the second member for engaging and axially retaining said bridge portion of said first member within the upper slot of the second member thereby preventing the unwanted axial separation of the two members.

* * * * *